US008789568B2

(12) United States Patent
Malik, Jr.

(10) Patent No.: US 8,789,568 B2
(45) Date of Patent: Jul. 29, 2014

(54) TAPE DETECTION SYSTEM

(75) Inventor: Richard S. Malik, Jr., Rossford, OH (US)

(73) Assignee: First Solar, Inc., Perrysburg, OH (US)

( * ) Notice: Subject to any disclaimer, the term of this patent is extended or adjusted under 35 U.S.C. 154(b) by 311 days.

(21) Appl. No.: 13/198,864

(22) Filed: Aug. 5, 2011

(65) Prior Publication Data

US 2012/0031549 A1     Feb. 9, 2012

Related U.S. Application Data

(60) Provisional application No. 61/371,505, filed on Aug. 6, 2010.

(51) Int. Cl.
| | |
|---|---|
| *B32B 41/00* | (2006.01) |
| *B25J 19/02* | (2006.01) |
| *B25J 13/08* | (2006.01) |
| *B25J 15/02* | (2006.01) |
| *B25J 9/10* | (2006.01) |
| *B25J 9/16* | (2006.01) |

(52) U.S. Cl.
CPC .............. *B25J 19/021* (2013.01); *B25J 13/086* (2013.01); *B25J 15/02* (2013.01); *B25J 9/1015* (2013.01); *B25J 9/1612* (2013.01); *B25J 9/1676* (2013.01); *Y10S 901/31* (2013.01); *Y10S 901/32* (2013.01); *Y10S 901/33* (2013.01); *Y10S 901/35* (2013.01); *Y10S 901/39* (2013.01); *Y10S 294/907* (2013.01)
USPC .............. 156/378; 156/64; 156/350; 156/351; 156/360; 156/362; 156/367; 156/379; 901/31; 901/32; 901/33; 901/35; 901/39; 294/907

(58) Field of Classification Search
CPC ........ B25J 13/086; B25J 15/02; B25J 19/021; B25J 9/1015; B25J 9/1612; B25J 9/1676
USPC ........... 156/64, 350, 351, 360, 362, 367, 378, 156/379; 901/31, 32, 33, 35, 39; 294/907
See application file for complete search history.

(56) References Cited

U.S. PATENT DOCUMENTS

| | | | | |
|---|---|---|---|---|
| 4,766,322 A | * | 8/1988 | Hashimoto | 250/559.33 |
| 5,221,058 A | * | 6/1993 | Fillis | 242/534.1 |
| 5,653,542 A | | 8/1997 | Sugimoto et al. | |
| 2005/0126692 A1 | | 6/2005 | Hajny et al. | |
| 2007/0068567 A1 | | 3/2007 | Rubin et al. | |
| 2007/0157777 A1 | | 7/2007 | Talou | |
| 2008/0101895 A1 | | 5/2008 | Holcomb et al. | |
| 2010/0084665 A1 | | 4/2010 | Daniels et al. | |
| 2010/0116325 A1 | | 5/2010 | Nikoonahad | |

FOREIGN PATENT DOCUMENTS

| | | |
|---|---|---|
| EP | 1 220 329 A2 | 7/2002 |
| EP | 2 086 025 A1 | 8/2009 |
| GB | 2 302 856 A | 2/1997 |
| JP | 58-59172 A | 4/1983 |
| JP | 63-139859 A | 6/1988 |

(Continued)

OTHER PUBLICATIONS

Banner, Guide to Sensing, First Edition, 2002, http://info.bannerengineering.com/xpedio/groups/public/documents/literature/120236.pdf.*

*Primary Examiner* — Katarzyna Wyrozebski Lee
*Assistant Examiner* — Joshel Rivera
(74) *Attorney, Agent, or Firm* — Dickstein Shapiro LLP

(57) ABSTRACT

Machines for manufacturing photovoltaic modules and methods for manufacturing photovoltaic modules can include tape handling components.

15 Claims, 8 Drawing Sheets

(56) References Cited

FOREIGN PATENT DOCUMENTS

| | | |
|---|---|---|
| JP | 1-92638 A | 4/1989 |
| WO | WO 2004/054913 A1 | 7/2004 |
| WO | WO 2008/093118 A2 | 8/2008 |
| WO | WO 2008/093118 A3 | 8/2008 |
| WO | WO 2011/039933 A1 | 4/2011 |

* cited by examiner

TAPE DETECTION SYSTEM

CROSS-REFERENCE TO RELATED APPLICATION

This application claims the benefit of U.S. Provisional Patent Application No. 61/371,505, filed Aug. 6, 2010, which is incorporated herein by reference in its entirety.

TECHNICAL FIELD

The present invention relates to machines for manufacturing photovoltaic modules and methods for manufacturing photovoltaic modules.

BACKGROUND

When manufacturing a photovoltaic module, a machine may dispense tape onto a surface of the module. A gripping mechanism associated with the machine may ensure proper placement of the tape on the module. Unfortunately, current machines can malfunction during the dispensing process resulting in scrap modules. It is therefore desirable to decrease the frequency of malfunctions or avoid malfunctions entirely.

DETAILED DESCRIPTION

Figure 1:
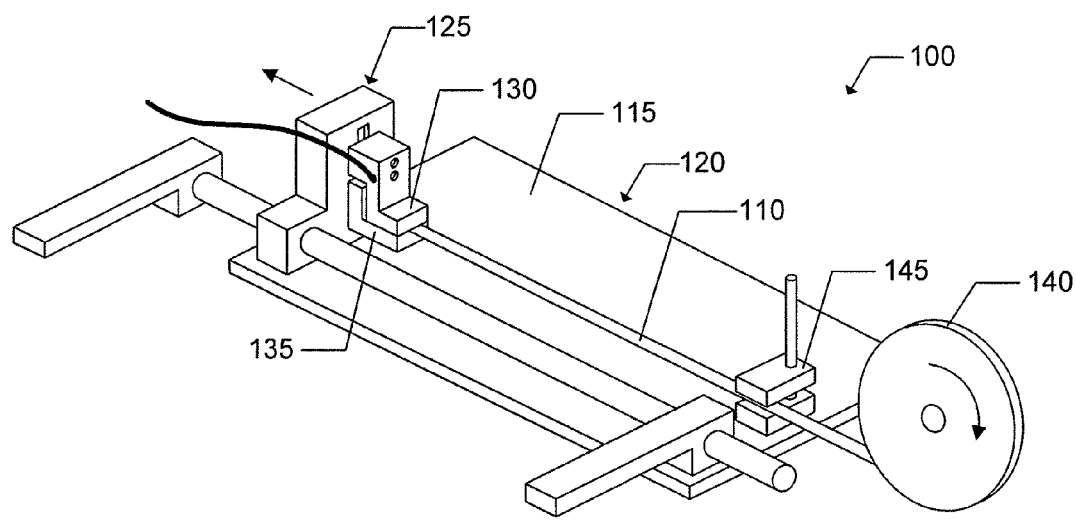
FIG. 1 is a tape dispensing machine for manufacturing a photovoltaic module.

A photovoltaic module may contain a plurality of layers disposed between an optically transparent front superstrate and a protective back substrate. The plurality of layers, which convert photons to electricity, may include a transparent conductive oxide layer, two semiconductor layers, and a back contact layer. The transparent conductive oxide layer may be formed adjacent to the front substrate. The two semiconductor layers, which form a p-n junction, may be formed adjacent to the transparent conductive oxide layer. The back contact layer may be formed adjacent to the semiconductor layers. Finally, the protective back substrate may be placed adjacent to the back contact layer to complete the photovoltaic module.

The back contact layer may include a series of widely spaced thin metal strips. The thin metal strips may transport electrical current from the semiconductor layers to a thin metal bus bar. The bus bar may be conductive tape disposed between the back contact layer and the substrate. The conductive tape may serve as a flexible bus bar and may interconnect cells within the photovoltaic module. The purpose of the tape is to provide an electrical path for current to travel from the back contact layer to a junction box on an outer surface of the module. The tape may include any suitable conductor. The conductive tape can include a conductive component, such as a foil, metal film, inorganic film or organic film, for example, a conductive polymer. In certain embodiments, the conductive tape can be a foil tape. For example, the tape may be a pressure-sensitive adhesive (PSA) tape having a tin-plated copper backing to ensure excellent conductivity and corrosion resistance.

When manufacturing the photovoltaic module, a machine may dispense tape onto a surface of the module. A gripping mechanism associated with the machine may ensure proper placement of the tape on the module. For example, a pair of jaws may come together to grasp one end of a roll of tape. The jaws may then move relative to the module and thereby draw tape onto the module. Unfortunately, current machines can malfunction during the dispensing process resulting in scrap modules. The challenge of managing malfunctioning tape dispensers can be addressed by including a detector within the gripping mechanism where the detector is capable of detecting whether the gripping mechanism securely grasps the tape before starting a cycle. Similarly, the detector is capable of detecting whether the mechanism securely grasps the tape during a cycle that is in progress. If the tape is not detected within the gripping mechanism, or if slippage of the tape from the gripping mechanism is detected, the dispensing process will stop to avoid creating a scrap module. An operator may then be notified so that corrective action can be taken.

In one aspect, a method for manufacturing a photovoltaic module may include providing a gripper comprising a sensor disposed within the gripper, securing a first end of a tape within the gripper, and moving the gripper relative to a photovoltaic module if the sensor detects the first end of the tape within the gripper. The method may include drawing the tape from a tape source and dispensing the tape onto a surface of the photovoltaic module. The method may include stopping the gripper if the sensor does not detect the first end of the tape within the gripper. The method may include producing an audible warning if the sensor does not detect the first end of the tape within the gripper. Similarly, the method may include producing a visual warning if the sensor does not detect the first end of the tape within the gripper. The method may include stopping the gripper if the sensor detects slippage of the first end of the tape relative to the gripper. The method may include producing an audible warning if the sensor detects slippage of the first end of the tape relative to the gripper. Similarly, the method may include producing a visual warning if the sensor detects slippage of the first end of the tape relative to the gripper. The method may also include completing dispensing of the tape, securing a portion of the tape with a stationary gripper positioned between the gripper and the tape source, and cutting the tape at a location between the gripper and the stationary gripper.

In another aspect, a tape dispensing machine for manufacturing a photovoltaic module may include a gripper and a sensor disposed within the gripper. The sensor may be configured to detect a first end of a tape within the gripper. The gripper may be movable mounted to the machine. The gripper may include a lower portion and an upper portion, and the upper portion and the lower portion may mate to grip the tape. The sensor may be mounted in the upper portion of the gripper, or the sensor may be mounted in the lower portion of the gripper. The tape may include tin-plated copper. The sensor may be a fiber optic sensor. The machine may include a tape source rotatably mounted to the machine. The machine may include a stationary gripper mounted to the machine and positioned between the gripper and the tape source. Also, the machine may include tape cutter mounted to the machine and positioned between the gripper and the stationary gripper. The machine may include a warning system mounted to the machine and connected to the sensor.

Figure 2:
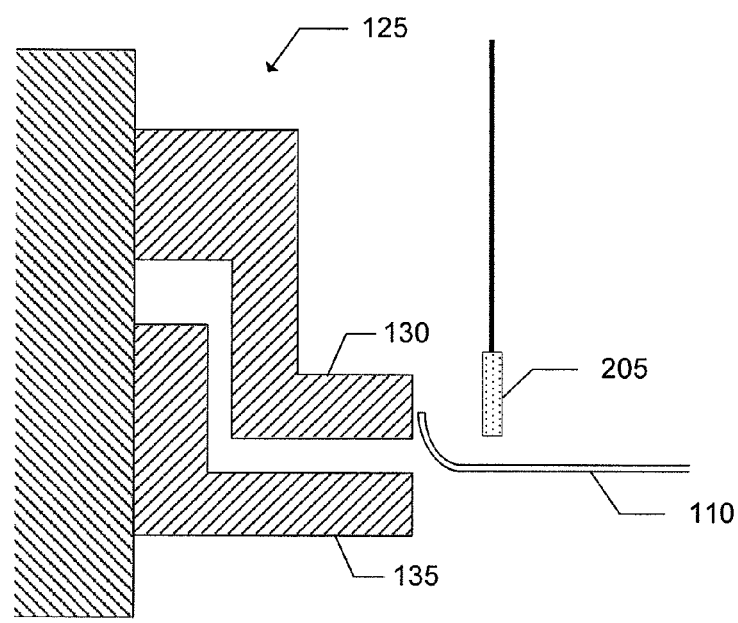
FIG. 2 is a gripper for a known tape dispensing machine.

When manufacturing a photovoltaic module 120, a machine 100 may dispense tape 110 onto a surface 115 of the module 120 as shown in FIG. 1. A gripping mechanism 125 associated with the machine may ensure proper placement of the tape 110 on the module 120. Unfortunately, current machines can malfunction during the dispensing process resulting in scrap modules. For example, as shown in FIG. 2, current machines may include a sensor 205 located outside of the gripping mechanism 125, where the sensor 205 is configured to detect the presence of the tape 110. However, due to the sensor's 205 placement, it is possible for the sensor 205 to detect the tape 110 even if the tape 110 is not secured within the gripper 125. For example, as shown in FIG. 2, the sensor 205 will convey the presence of the tape 110 to the control system despite the tape 110 not being secured properly between an upper portion 130 and a lower portion 135 of the gripper 125. As a result, the manufacturing process will proceed without the tape 110 secured within the gripper 125, thereby resulting in a scrap module.

Figure 3:
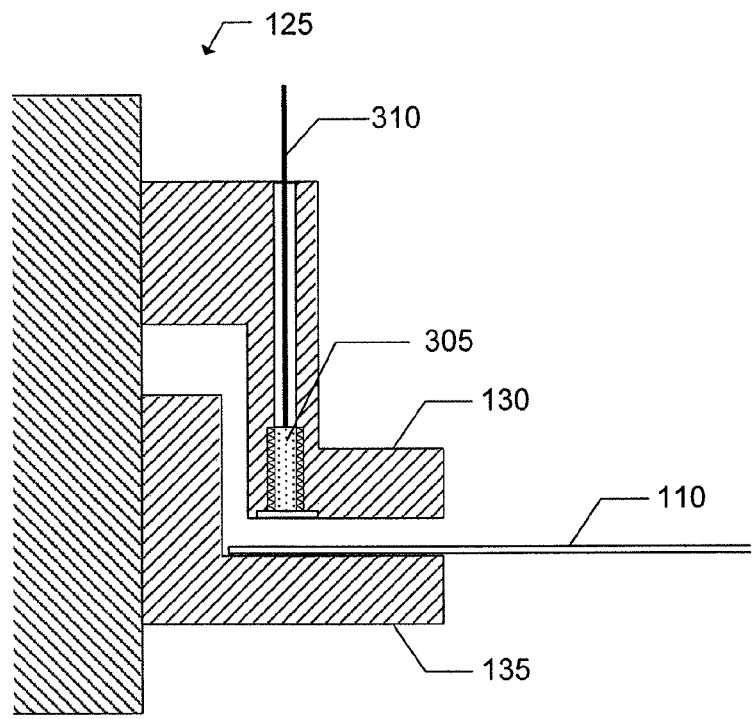
FIG. 3 is a gripper for a tape dispensing machine in an open position
Figure 4:
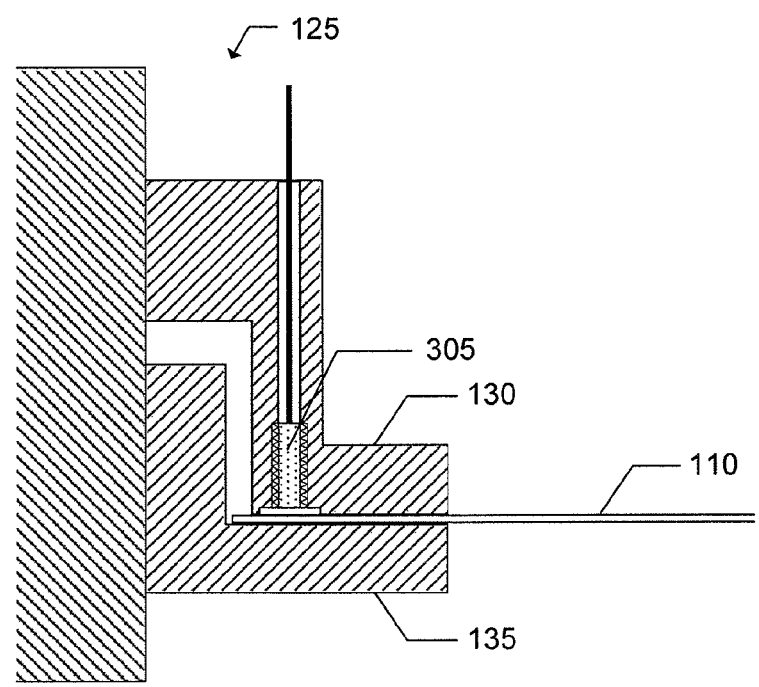
FIG. 4 is a gripper for a tape dispensing machine in a closed position.
Figure 5:
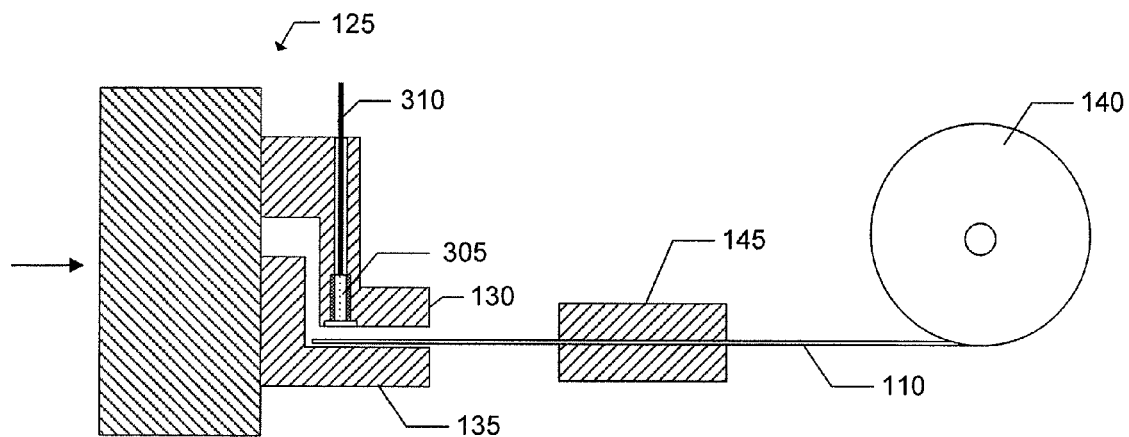
FIG. 5 is a first stage in a manufacturing process.

To avoid producing scrap modules, the machine 100 must be redesigned to avoid conveyance of false readings to the control system. This problem is solved by including a sensor 305 within the gripper 125 where the sensor is capable of accurately detecting whether the gripper 125 is securely grasping the tape 110 before commencing a cycle. As shown in FIGS. 3 and 4, the sensor 305 is repositioned inside the gripper 125. As a result, the sensor 305 provides accurate signals regarding the presence and position of the tape 110. The sensor 305 can be positioned in the upper portion 130 or the lower portion 135 of the gripper 125, thereby enabling it to detect the tape. A hole may be drilled into the gripper 125 to provide access for the sensor 305. The sensor 305 can then be threaded into the hole to ensure proper alignment and to provide a secure mounting location. Alternately, any other manner of securing the sensor 305 to the gripper 125 may be used.

The gripper 125 may be configured to grasp one end of the tape 110 and draw the tape from a tape source 140, such as a spool, into position on the module's surface 115. For instance, when a module 120 arrives at the tape dispensing machine 100, a section of tape 110 may be drawn into position by the gripper 125. Once the tape is in place, the module 120 may move along to the next stage of manufacturing. The gripper 125 may then prepare for another cycle by returning to its starting point and grasping another piece of tape destined for the next module.

Figure 6:
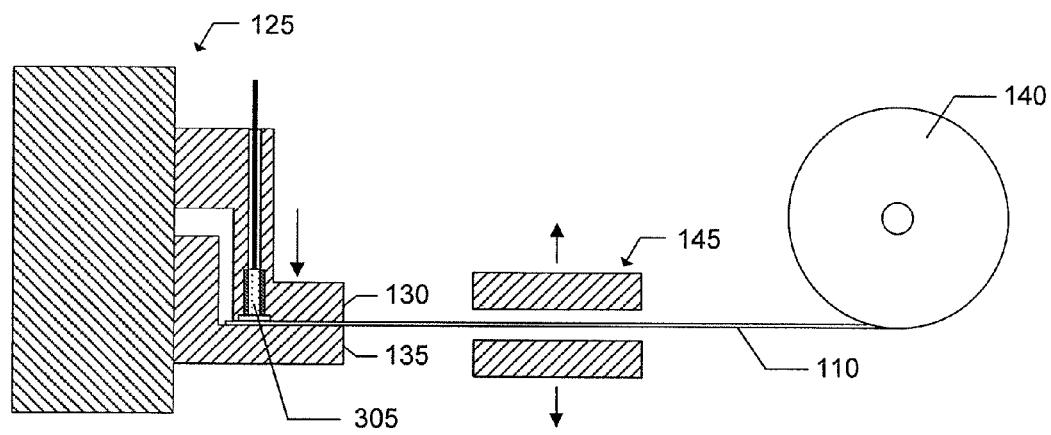
FIG. 6 is a second stage in a manufacturing process.
Figure 7:
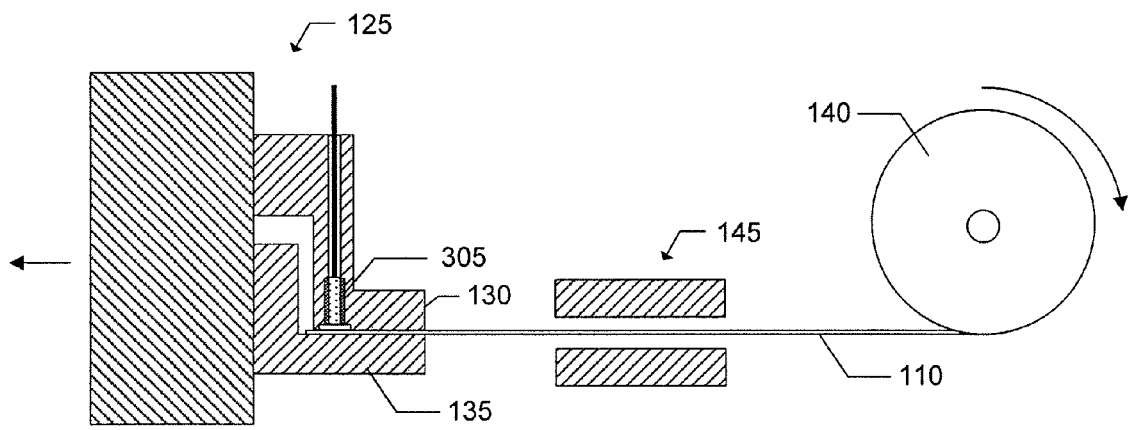
FIG. 7 is a third stage in a manufacturing process.
Figure 8:
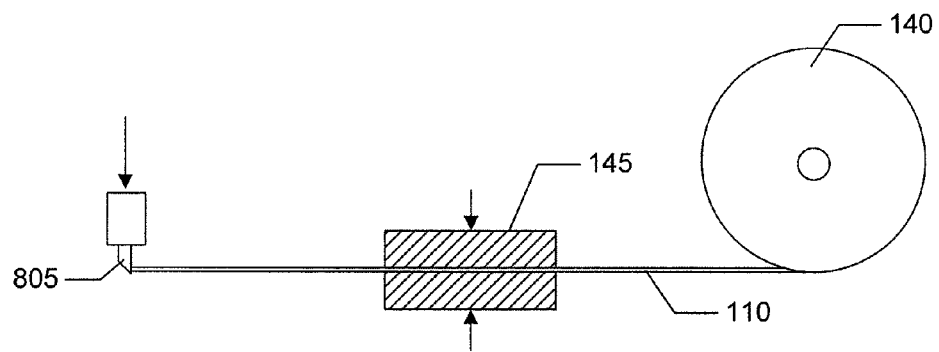
FIG. 8 is a fourth stage in a manufacturing process.

FIGS. 5-8 depict four stages of a manufacturing process where tape is dispensed from a tape source 140 onto the surface 115. During the first stage, a stationary gripper 145 may be mounted to the machine 100 and may clamp the tape 110 to prevent the tape source 140 from unraveling. By holding the tape 110 in place, the stationary clamp 145 enables the gripper 125 to move into position and grasp one end of the tape 110. For example, as shown in FIG. 6, when the gripper 125 is in position, the upper portion 130 and lower 135 portion come together against an end of the tape 110. Once the gripper 125 has secured the end of the tape 110, the stationary clamp 145 may release the tape as shown in FIG. 6. Next, as shown in FIG. 7, the gripper 125 may move away from the tape source 140, thereby drawing tape 110 from the tape source and depositing the tape onto the surface 110. Once a desired amount of tape 110 has been drawn from the tape source 140, the stationary clamp 145 may again move towards the tape 110 and secure it to prevent unraveling of the tape source, and a cutting blade 805 may sever the tape 110 as shown in FIG. 8. By securing an end of the tape 110 in a fixed position, the stationary clamp 145 ensures the machine 100 is ready for the next application cycle.

Figure 9:
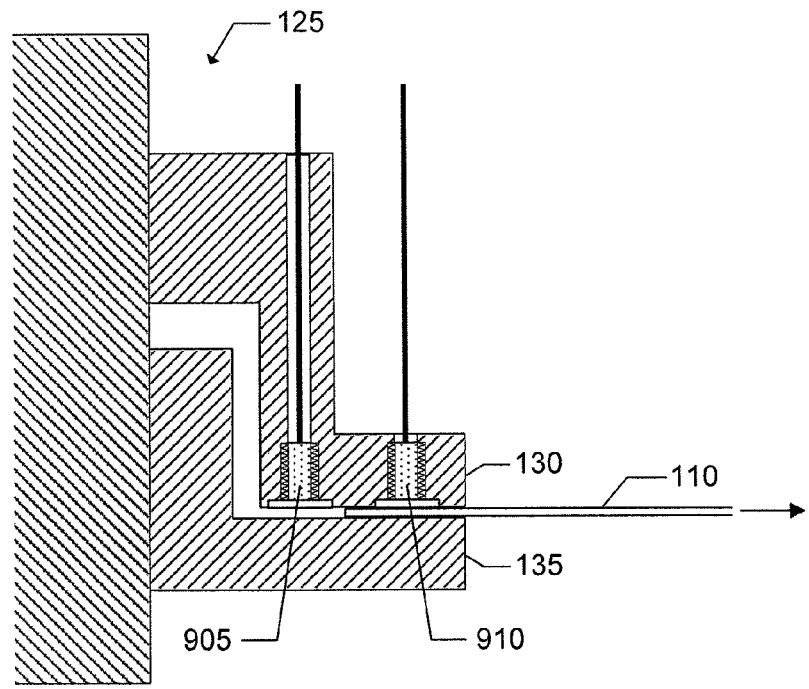
FIG. 9 is a tape dispensing machine including multiple sensors.

If the tape 110 is not detected within the gripper 125 during the steps depicted in FIGS. 6 and 7, the dispensing process will stop to avoid creating a scrap module. Similarly, if slippage of the tape 110 from the gripper 125 is detected during the step depicted in FIG. 7, the dispensing process will stop to avoid creating a scrap module. Slippage of the tape is defined as relative motion between the tape 110 and the gripper 125 that indicates the tape is slipping from the gripper. By stopping the process at the first sign of slippage, the operator can be notified, and corrective action can be taken before a scrap module is created. Slippage can be indicated by a weakening of the detector signal caused by the tape 110 moving beyond the sensor's 305 line of sight, which occurs when the tape slips from the gripper. Similarly, if multiple sensors (905, 910) are positioned within the gripper 125, as shown in FIG. 9, slippage may be indicated by a first sensor's 905 signal weakening while a signal from a second sensor 910, which is located closer to the tape source 140, remains constant. Therefore, by comparing signal strengths of adjacent detectors, slippage can be identified early, and corrective action can be implemented before a scrap module is created. Any suitable combination of sensors at any suitable positions can be utilized and any suitable alarm and/or feedback or control system can be based on or connected to the sensor system. For example, if tape 110 is not detected by first sensor 905 but still detected at second sensor 910, a control system can determine that the tape has slipped but is still sufficient to tape the module to within specifications. In such a situation, an indicator can indicate to an operator that the system requires adjustment. However, if neither first sensor 905 of second sensor 910 detects tape 110, tape 110 may have slipped to such a degree that continuing the taping process will result in unusable modules. In such a situation, a control system can automatically stop the production cycle and/or an indicator can indicate to an operator that adjustment is needed.

The detector may be any sensor 305 capable of detecting the presence of tape 110. For example, the sensor may be a fiber optic sensor, or the sensor may be a hall effect sensor capable of detecting disturbances in a magnetic field. Alternately, the detector may be a two-piece sensor with one piece positioned in the upper portion of the gripper and a second piece positioned in the lower portion. A two piece sensor may be a vision system employing a light source and a photodetector capable of detecting tape between the two pieces. The sensor may include or a wire 310 or it may be wireless. Where a fiber optic sensor is used, the wire 310 may be a fiber optic cable.

During the grasping process, the upper portion 130 may move towards the lower portion 135, or the lower portion 135 may move towards the upper portion 130. Alternately, each portion (130, 135) may move towards the other portion. Any other suitable method for securing the tape 110 may be employed. For example, any form of temporary attachment may be used including clips, adhesive, magnetism, or suction.

If the tape 110 is not detected within the gripper 125, an operator may be notified so that corrective action can be taken. For example, a visual or audible warnings may be displayed proximate to the machine 100, or a warning may be conveyed to a computerized monitoring system. Once notified of the stoppage, the operator can evaluate the situation and adjust the tape within the gripper 125 and the tape source 140 as required.

Figure 11:
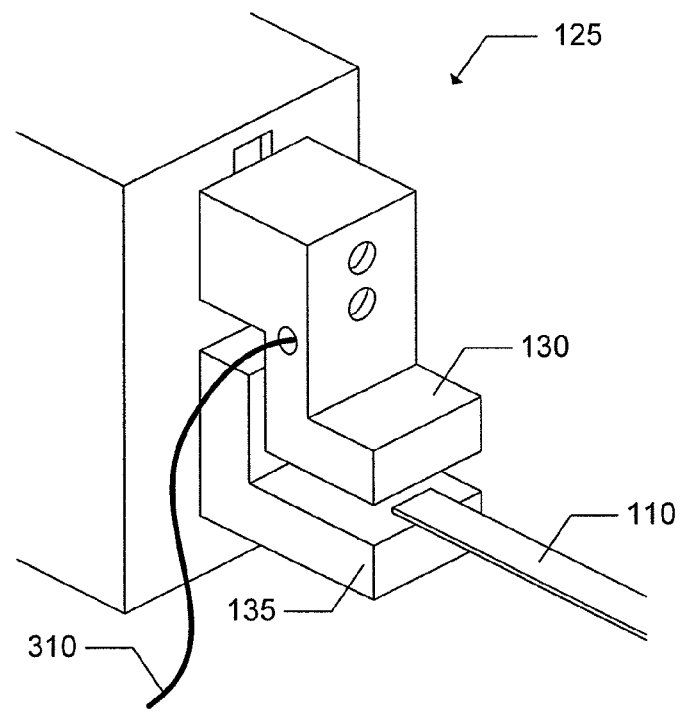
FIG. 11 is a gripper for a tape dispensing machine.
Figure 12:
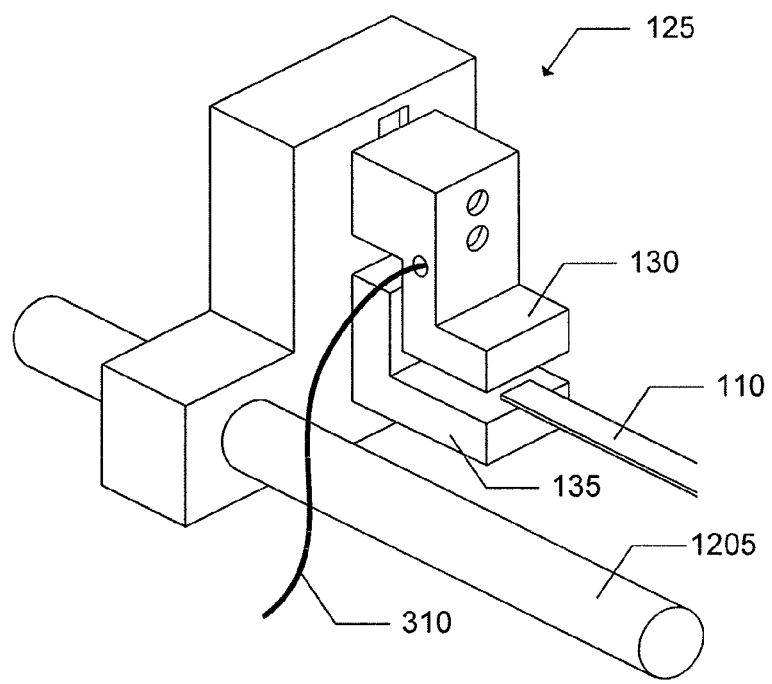
FIG. 12 is a gripper for a tape dispensing machine.

The gripper 125, as shown in FIG. 11, may be propelled in any suitable way. For example, the gripper 125 may be positioned on a rail system 1205 as shown in FIG. 12. The gripper 125 may be coupled to a drive system capable of moving the gripper 125 towards and away from the tape source 140. Any suitable drive type may be used to propel the gripper 125 such as mechanical, pneumatic, hydraulic, or electrical.

As described above, methods of manufacturing photovoltaic modules employ a tape dispensing machine 100. In a particular embodiment, the machine is capable of rapidly and accurately dispensing tape 110 onto a surface of the module 120 during assembly. For example, the machine 100 may deposit a tape onto a glass substrate. The machine 100 may include several components including a gripper 125 that is movably mounted to the machine. For example, the gripper 125 may be mounted to a slide rail system 1205 and may have a drive mechanism capable of propelling the gripper back and forth along the rail system. The gripper 125 is capable of securing an end of the tape 110 and drawing it from a tape source 140 as it is propelled along the rail system 1205. Through this motion, the gripper 125 is able to position the tape 110 in its intended location on the module 120.

During the application process, the sensor 305 may provide feedback to a computer system. For example, during the application stages depicted in FIGS. 5-7, the sensor 305 may provide feedback to the computer system indicating the presence of the tape 110 within the gripper 125. Before proceeding from the first stage to the second stage, the computer may verify the tape 110 is secured within the gripper 125. During the second stage in the cycle, the gripper 125 may move away from the tape source 140. While the gripper is moving, the computer may verify that the tape 110 has not slipped, and is not slipping, from the gripper by monitoring the signal received from the sensor 305. If the feedback from the sensor 305 indicates the tape 110 is no longer positioned within the gripper 125, or is slipping from the gripper 125, the cycle will stop. The operator may then be notified of the problem through an audible or visual signal associated with a warning system. For example, a horn may sound or a red light may blink to indicate that an error has been detected. By stopping the process when an error is detected, the creation of scrap products can be avoided. Similarly, the creation of products requiring rework may be avoided. As a result, assembly line efficiency is increased and waste is decreased.

A stationary sensor 1005 may be positioned in or near the stationary gripper 145. Similar to the first sensor 305, the second sensor may be used to detect the presence and position of the tape 110. During the stages depicted in FIG. 5-8, the stationary sensor 1005 may provide feedback to the computer system regarding the presence of the tape 110. Before moving the gripper 125 towards the stationary gripper 145, computer system may require confirmation from the stationary sensor that tape 110 is present.

Figure 10:
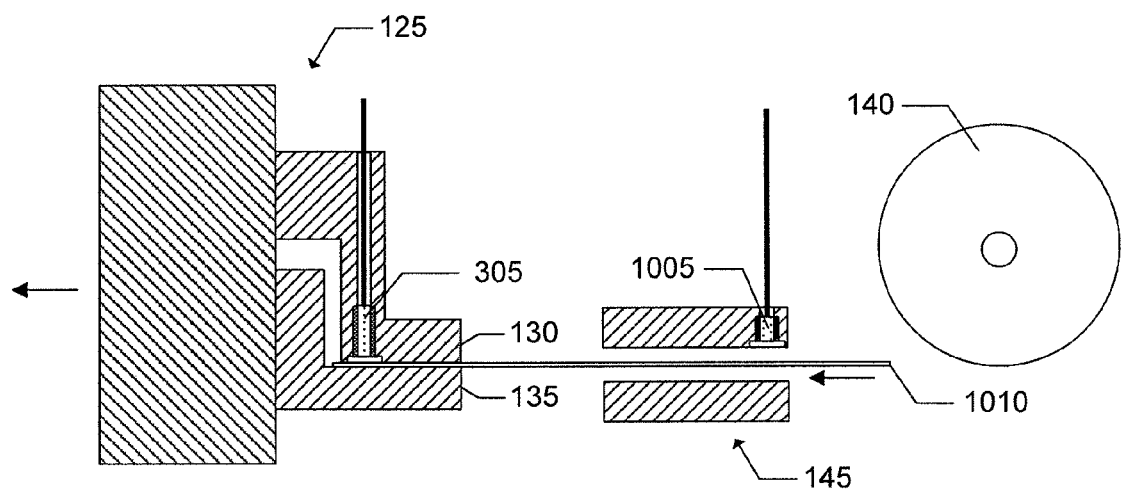
FIG. 10 is a tape dispensing machine including multiple sensors.

The stationary sensor 1005 may also be useful for detecting when the tape source 140 must be changed. For example, as shown in FIG. 10, a stationary sensor 1005 mounted to the stationary gripper 145 may identify when the tape source 140 is empty by identifying when a second end 1010 of the tape 110 passes the sensor 1005. The machine 100 can then be stopped and the empty spool can be replaced with a full spool. Detection and changing of tape source 140 can be accomplished in any suitable manner.

The machine may include a computer containing software program that permits execution of one or more manufacturing processes. For instance, the software may enable application of tape with little or no manual input. A partially completed photovoltaic module 120 may enter the machine and a program may be initiated which automatically applies tape 100 as described herein. The computer may continuously monitor signals from the one or more detectors (e.g. 305, 905, 910, 1005) and make adjustments to the manufacturing process based on those signals. For instance, the computer may receive and compare detector signals and compare those signals to desired values in a lookup table or software code. If the values do not match, the process will be halted to avoid producing a scrap module. To ensure adequate control, the computer may be configured to continuously compare actual values to target values during the manufacturing process. For instance, the computer may be configured to compare values every 10 milliseconds.

The tape dispenser may also include a cutting blade 805, as shown in FIG. 8. The cutting blade 805 may be actuated after the proper amount of tape 110 has been dispensed. For instance, based on input parameters and signals from the detectors, the computer may identify when the proper amount of tape 110 has been dispensed. At this moment, the computer may actuate the cutting blade 805, thereby severing the tape.

The cutting blade 805 may move linearly, in an up and down direction, to facilitate cutting. Alternately, the cutting blade 805 may be pivotally mounted to the machine. The cutting blade 805 may be attached to a hub. By rotating the hub in a counterclockwise direction, the cutting blade 805 may be brought into contact with the tape. If sufficient torque is applied to the hub, the cutting blade 805 will shear the tape. Any other suitable cutting method may be employed.

Although the figures depict a moving gripper 125 and a stationary tape source 140, this is not limiting. For example, the gripper 125 may remain still while the tape source 140 moves relative to the gripper 125. In one particular embodiment, the tape source 140 may be mounted on a rail system having a drive system that allows the tape source to move axially. As a result, the tape source 140 may traverse and apply tape 110 to the module 120, producing a similar result as the other methods described herein.

Figure 13:
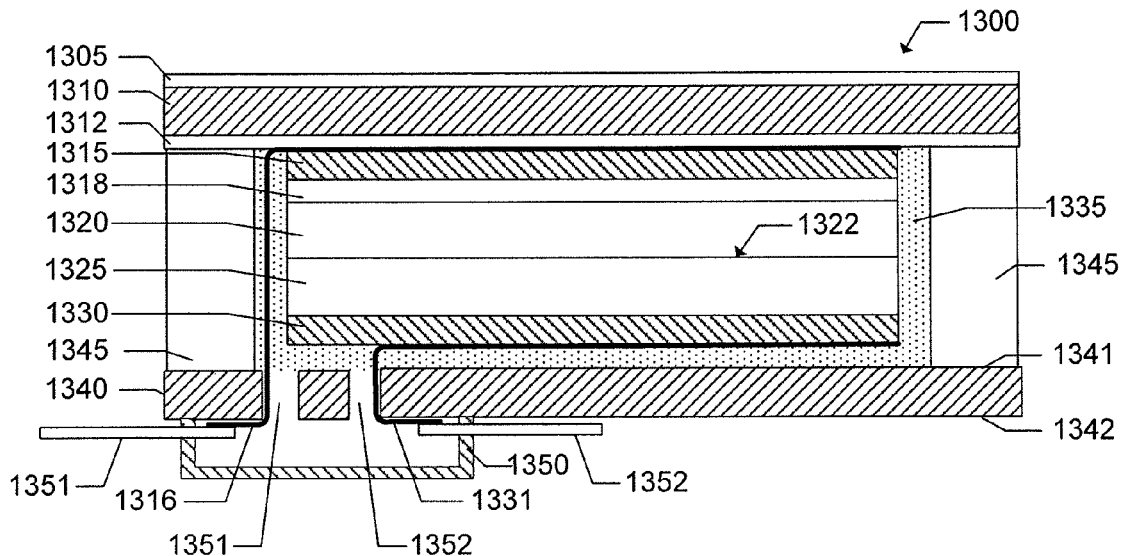
FIG. 13 is a cross section of a photovoltaic module.

The photovoltaic module 120 may be more elaborate than the basic module described above and may include any suitable components, materials, configurations, or combinations thereof. For example, as shown in FIG. 13, the photovoltaic module 1300 may contain an anti-reflective coating and/or surface 1305 formed on the superstrate layer 1310. The superstrate layer 1310 may be formed from an optically transparent material such as soda-lime glass. Adjacent to the superstrate layer 1310, a barrier layer 1312 may be formed to lessen diffusion of sodium or other contaminants from the superstrate layer 1310. The barrier layer 1312 may include silicon dioxide or any other suitable material. A transparent conductive oxide (TCO) layer 1315 may be formed between the barrier layer 1312 and a buffer layer 1318 and may serve as a front contact for the module 1300. In forming the TCO layer 1315, it is desirable to use a material that is both highly conductive and highly transparent. For example, the TCO layer 1315 may include tin oxide, or any other suitable material. A buffer layer 1318 may be formed between the TCO layer 1315 and a semiconductor window layer (for example, an n-type semiconductor) 1320.

The semiconductor window layer 1320 may include any suitable material, such as cadmium sulfide. A semiconductor absorber layer 1325 may be formed adjacent to the semiconductor window layer 1320 and may include any suitable material, such as cadmium telluride. Semiconductor absorber layer 1325 can include any other suitable material, such as amorphous or crystalline silicon, or copper indium gallium (di)selenide. Several of these photovoltaic technologies are discussed in U.S. patent application Ser. No. 12/572,172, filed on Oct. 1, 2009, which is incorporated by reference in its entirety. The semiconductor absorber layer 1325 may be deposited using any suitable deposition method. A p-n junction 1322 is formed where semiconductor absorber layer 1325 meets the semiconductor window layer 1320. Current created in the photovoltaic cell may flow between a first lead 1316 formed adjacent to the TCO layer 1315 and a second lead 1331 formed adjacent to a back contact layer 1331. The back contact layer 1330 may be formed adjacent to the semiconductor absorber layer 1325. A plurality of layers formed between the superstrate layer 1310 and substrate layer 1340 may be covered by an interlayer 1335.

The substrate layer 1340 may be formed adjacent to the interlayer 1335 and may further protect the back side of the module. The substrate layer 1340 may be constructed from soda-lime glass or any other suitable material. As described above, the substrate layer 1340 may have a first hole 1351 and a second hole 1352 which extend though the substrate 1340 from a top surface 1341 to a bottom surface 1342. A first lead 1316 may contact the TCO layer 1315 and may pass through the first hole 1351. A second lead 1331 may contact the back contact layer 1330 and may pass though the second hole 1352. The first and second leads (1316, 1331) may be affixed to the bottom surface 1342 of the substrate 1340 using adhesive. The adhesive may be integral to the tape, or it may be applied to the tape. A junction box 1350 may be placed over the holes (1351, 1352) and the leads (1316, 1331) to protect the module 1300 from moisture ingress. The junction box 1350 may allow for interconnection of the module 1300 to other modules and electrical devices. For example, a first wire 1351 may enter the junction box 1350 and may be joined to the first lead 1316. Similarly, a second wire 1352 may enter the junction box 1350 and may be joined to the second lead 1331. The joining may be accomplished through soldering, brazing, welding or any other suitable technique that results in a low resistance junction.

Figure 14:
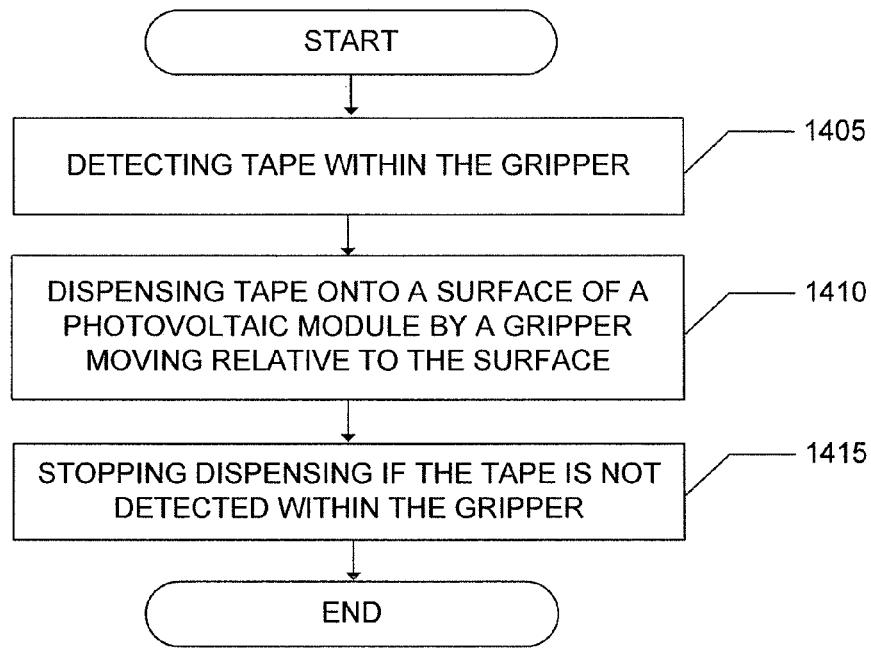
FIG. 14 is a flow chart of a method for manufacturing a photovoltaic module.

As shown in FIG. 14, a method for preparing a substrate layer for a photovoltaic module may include detecting tape within the gripper 1405, dispensing tape onto a surface of a photovoltaic module by the gripper moving relative to the surface 1410, and stopping dispensing if the tape is not detected within the gripper. The surface may be any surface associated with any layer of the module.

Figure 15:
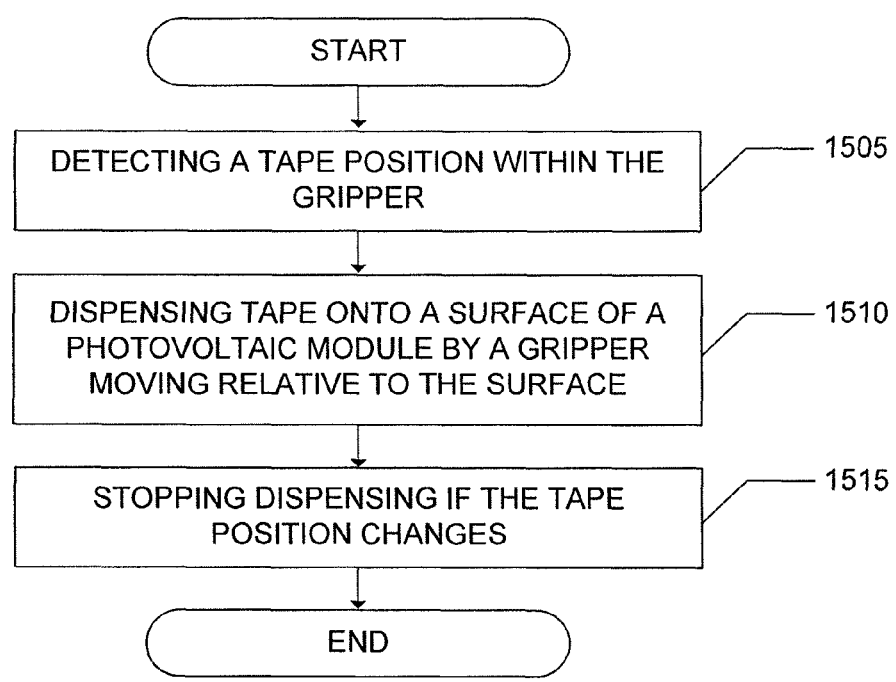
FIG. 15 is a flow chart of a method for manufacturing a photovoltaic module.

As shown in FIG. 15, a method for manufacturing a photovoltaic module may include detecting a tape position within a gripper 1505, dispensing tape onto a surface of the photovoltaic module by the gripper moving relative to the surface 1510, and stopping dispensing if the tape position changes within the gripper 1515. The surface may be any surface associated with any layer of the module.

Details of one or more embodiments are set forth in the accompanying drawings and description. Other features, objects, and advantages will be apparent from the description, drawings, and claims. Although a number of embodiments of the invention have been described, it will be understood that various modifications may be made without departing from the spirit and scope of the invention. In particular, steps depicted in figures may be executed in orders differing from the orders depicted. For example, steps may be performed concurrently or in alternate orders from those depicted. It should also be understood that the appended drawings are not necessarily to scale, presenting a somewhat simplified representation of various features and basic principles of the invention.

What is claimed is:

1. A tape dispensing machine for use in dispensing a tape in manufacturing a photovoltaic module, the machine comprising:
a gripper for gripping a tape and comprising an upper portion and a lower portion, which are movable relative to one another to grip a tape; and
a sensor disposed only within one of the upper portion and the lower portion of the gripper, wherein the sensor is configured to detect a first end of a tape within the gripper.

2. The machine of claim 1, wherein the gripper is movably mounted to the machine.

3. The machine of claim 1, wherein the upper portion and the lower portion mate to grip the tape.

4. The machine of claim 3, wherein the sensor is mounted in the upper portion of the gripper.

5. The machine of claim 3, wherein the sensor is mounted in the lower portion of the gripper.

6. The machine of claim 1, further comprising a tape graspable by the gripper, wherein the tape comprises tin-plated copper.

7. The machine of claim 1, wherein the sensor is a fiber optic sensor.

8. The machine of claim 1, further comprising a tape source rotatably mounted to the machine.

9. The machine of claim 1, further comprising a stationary gripper mounted to the machine and positioned between the gripper and the tape source.

10. The machine of claim 9, further comprising a tape cutter mounted to the machine and positioned between the gripper and the stationary gripper.

11. The machine of claim 1 further comprising a warning system mounted to the machine and connected to the sensor.

12. The machine of claim 1, further comprising a second sensor disposed within the gripper and laterally of the sensor to detect the tape within the gripper, wherein the second sensor is mounted in the same one of the upper portion and the lower portion as the sensor and both the sensor and the second sensor are directed toward the other of the upper portion and the lower portion.

13. The machine of claim 9, further comprising a second sensor disposed within the stationary gripper to detect the tape within the stationary gripper.

14. The machine of claim 12, wherein respective signals from the sensor and the second sensor indicate slippage of a tape held in the gripper.

15. The machine of claim 1, wherein the sensor is a Hall effect sensor.

* * * * *